United States Patent [19]

Simko

[11] 4,274,012
[45] Jun. 16, 1981

[54] SUBSTRATE COUPLED FLOATING GATE MEMORY CELL

[75] Inventor: Richard T. Simko, Los Altos, Calif.

[73] Assignee: Xicor, Inc., Los Altos, Calif.

[21] Appl. No.: 6,030

[22] Filed: Jan. 24, 1979

[51] Int. Cl.³ .................... H03K 5/00; H01L 29/78; H01L 27/02; G11C 11/34
[52] U.S. Cl. .................... 307/238.3; 357/23; 357/41; 357/54; 357/59; 365/185
[58] Field of Search .................... 357/23, 41, 54; 307/238; 365/185

[56] References Cited

U.S. PATENT DOCUMENTS

| | | | |
|---|---|---|---|
| 4,099,196 | 7/1978 | Simko | 357/23 |
| 4,203,158 | 5/1980 | Frohman-Bentchkowsky et al. | 357/54 |
| 4,209,849 | 6/1980 | Schrenk | 357/23 |

Primary Examiner—Gene M. Munson
Attorney, Agent, or Firm—Fitch, Even, Tabin, Flannery & Welsh

[57] ABSTRACT

Nonvolatile semiconductor electrically-alterable, floating-gate memory methods and devices which utilize substrate coupling for self-regulated, tunnel-current-shaping to provide improved device characteristics. The substrate coupling also facilitates the cell interconnection to other circuit elements.

26 Claims, 6 Drawing Figures

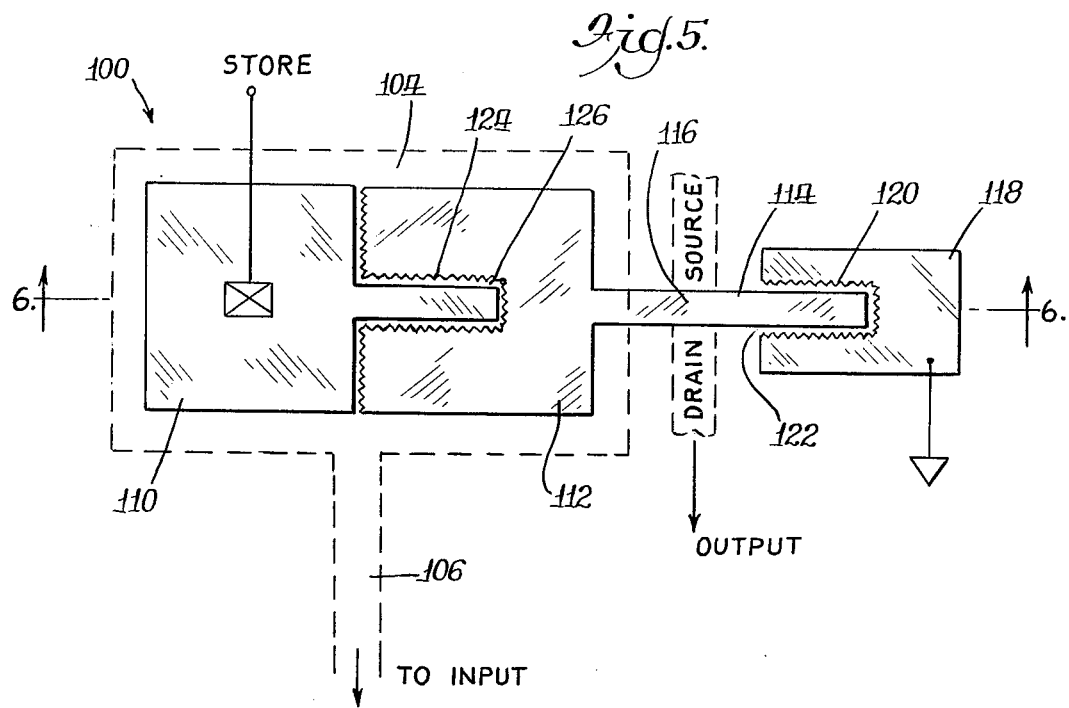
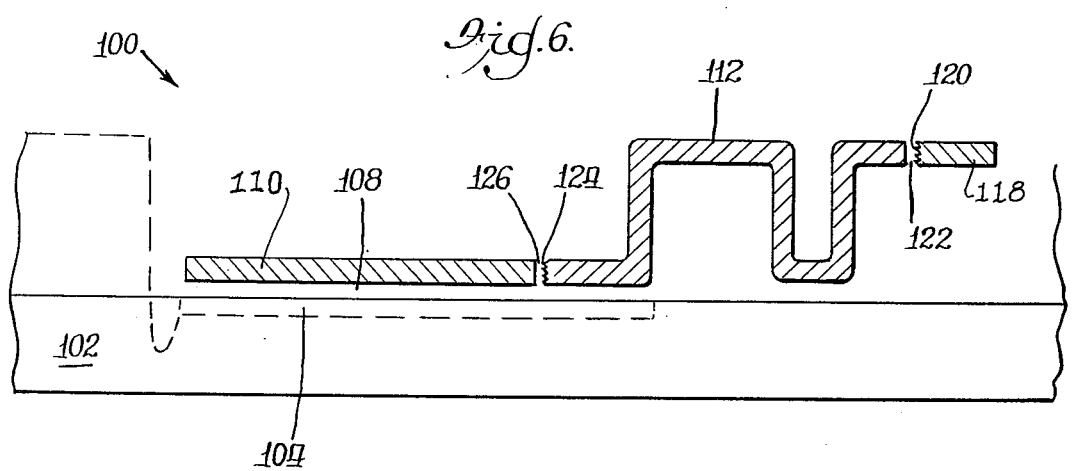

SUBSTRATE COUPLED FLOATING GATE MEMORY CELL

The present invention is generally directed to nonvolatile semiconductor memory devices and methods, and more particularly is directed to novel nonvolatile MOS floating-gate memory systems utilizing substrate coupling enhancement of electron injection to the floating gate.

In data processing systems, memory devices and methods for the storage of information are of critical importance. A long-standing practical problem associated with semiconductor technology is that most conventional semiconductor memory elements are volatile, i.e., when power is removed, the contents of the memory is lost. Many structures have been proposed or demonstrated for providing nonvolatility to semiconductor memory circuits. However, practical difficulties such as limitations on the number of useful erase-write cycles which may be effected during the lifetime of a device, retention time of data by the memory device and operational restrictions limiting ease of use or the ability to carry out electrical modification of the stored data, have tended to restrict the utility of such nonvolatile semiconductor devices having a floating gate structure. In this regard, devices based on a MOS (metal-oxide-semiconductor) floating gate structure are conventionally employed in nonvolatile memory structures. Such devices use a floating gate island of conducting material, which is electrically insulated from the substrate, but capacitively coupled to the substrate to form the gate of a MOS transistor adapted to sense the state of charge of the floating gate. Depending on the presence or absence of charge on the floating gate, this MOS transistor may be placed in a conducting ("on") state or nonconducting ("off") state for storage of binary "1"s or "0"s. Various means of introducing and removing the signal charge from a floating gate have been used in such memory devices. Charge can be introduced onto the floating gate using hot electron injection and/or tunneling mechanisms. Once charge is introduced to the floating gate, it remains (effectively) permanently trapped on the gate because the floating gate is completely surrounded by an insulating material, which acts as a barrier to the discharging of the floating gate. Charge can be removed from the floating gate by exposure to radiation (UV light, x-rays), avalanche injection, or by tunneling effects.

Various device structures are conventionally utilized to convey charge to and from the floating gate and a substrate [Frohmann-Bentchkowsky, "A Fully-Decoded 2048-Bit Electrically-Programmable MOS-ROM", Digest, 1971, IEEE International Solid State Circuits Conference, pp. 80–81; U.S. Pat. Nos. 3,660,819; 3,996,657 and 4,037,242. However, high currents must be drawn during writing of electrons to the floating gate ("programming") of such devices because only a small fraction of the programming current is sufficiently displaced and energetic to reach the floating gate through the relatively thick oxide (e.g., 1000 Å). Another technique is to use a very thin oxide of precisely predetermined thickness in the range of approximately 50–200 Å to separate the floating gate from a programming terminal in the substrate [E. Harari, "A 256-Bit Nonvolatile Static RAM", Digest 1978 IEEE International Solid State Circuits Conference, pp. 108–109; U.S. Pat. No. 3,500,142]. However, it is difficult to reliably manufacture such very thin oxide layers of precisely controlled thickness and electrical properties in large-scale production.

Enhanced tunneling between multiple layers of polysilicon can form the basis for additional nonvolatile elements, and various semiconductor devices using such enhanced tunneling have been proposed [DiMaria and Kerr, "Interface Effects and High Conductivity in Oxides Grown from Polycrystalline Silicon", Applied Physics Letters, pp. 505–507, November, 1975; Andersen and Kerr, "Evidence for Surface Asperity Mechanism of Conductivity in Oxides Grown in Polycrystalline Silicon", J. Applied Physics, pp. 4834–4836, Vol. 48, No. 11, November, 1977; U.S. Pat. No. 4,099,196; Berenga et al., "$E^2$ PROM TV Synthesizer", 1978 IEEE International Solid State Circuit Conference, pp. 196–197]. Such enhanced tunneling permits relatively thick oxides to separate tunneling elements, using relatively conventional programming voltages. However, such conventional nonvolatile semiconductor memory devices still have various disadvantages and limitations, and improved floating gate semiconductor devices would be desirable. In this connection, various destructive mechanisms are associated with conventional charge injection/removal processes. High current densities to the floating gate through the insulating material are known to degrade the number of device cycles. One practical effect is to limit the total number of charge injection and charge removal operations, or "cycles", which may be carried out on the floating gate device. Since total cycle number and charge retention lifetime are crucial parameters to the useful device lifetime in service, it becomes apparent that particular structures and means of charge transport relating to the floating gate are of paramount importance in minimizing these inherently detrimental effects.

Accordingly, it is an object of the present invention to provide improved floating gate methods and devices using substrate coupling for an electrically-alterable nonvolatile semiconductor memory element. It is another object of the present invention to provide methods and apparatus for limiting and shaping the instantaneous currents transported through oxides to enhance useful device lifetime.

These and other objects of the invention will become apparent in view of the following detailed description and the accompanying drawings of which:

FIG. 5 is a top view of another embodiment of a nonvolatile electrically programmable floating gate memory cell having a lateral tunneling electrode structure, and FIG. 6 is a cross-sectional side view of the embodiment of FIG. 5.

Figure 1:
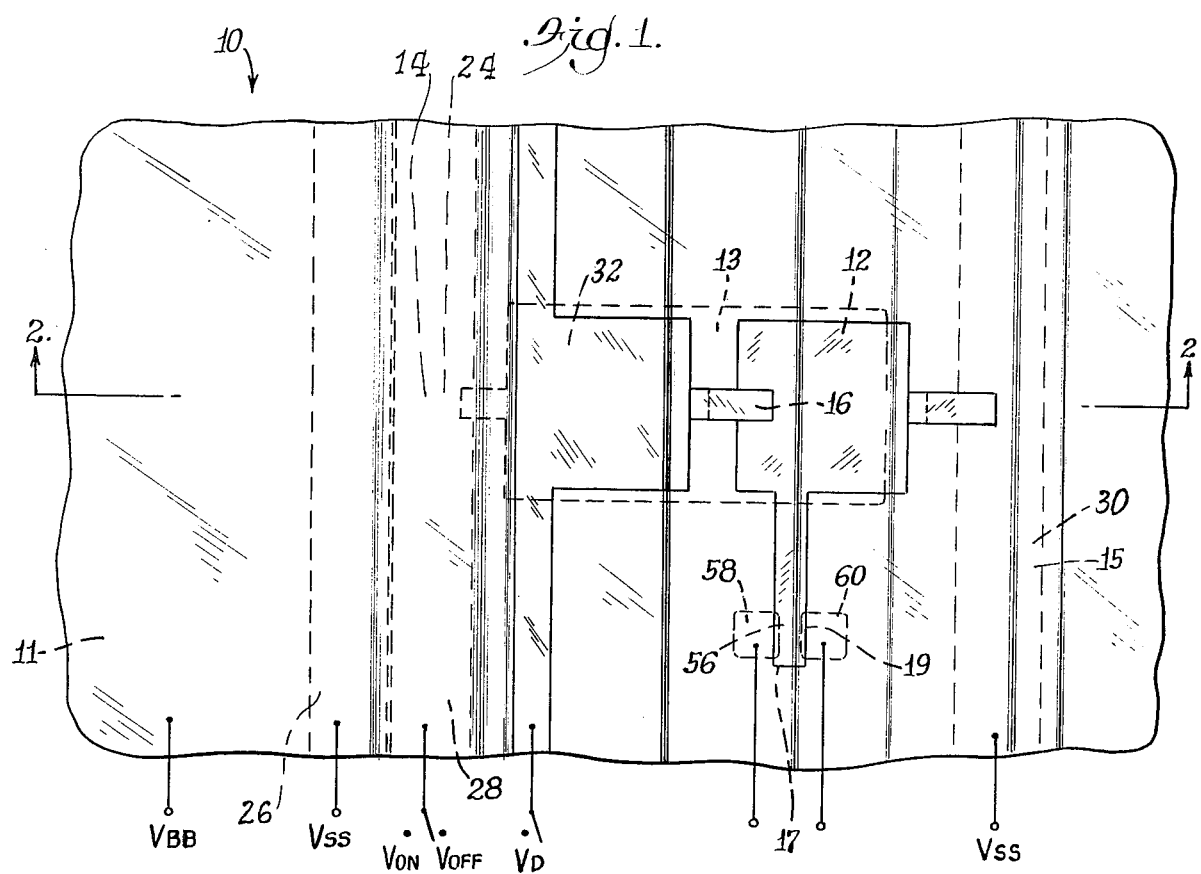
FIG. 1 is a top view of a nonvolatile electrically programmable semiconductor floating gate memory cell embodiment of the present invention.

Generally, the present invention is directed to nonvolatile, electrically-alterable semiconductor memory elements of the floating gate type having an automatic self-regulating structure which is adapted to limit the programming currents applied to the floating gate and to enhance the number of useful memory cycles. The invention is also directed to methods for charging and discharging the floating gate of such devices. In this connection, devices in accordance with the invention comprise a substantially monocrystalline semiconductor substrate of one conductivity type, and an electrically isolated floating gate conductor overlying the substrate. The devices further comprise an electron injection means for injecting electrons onto the floating gate to provide said floating gate with a negative potential, electron removal means for removing electrons from the floating gate to provide said floating gate with a potential more positive than said negative potential, an electrically isolatable bias electrode in said substrate of conductivity type opposite that of said substrate which is capacitively coupled to the floating gate, and means for detecting the potential state of the floating gate. These elements may be combined to provide an automatically self-regulating circuit system which tends to enhance the number of useful device cycles, as will be more fully described hereinafter.

As indicated, the devices comprise a substantially monocrystalline semiconductor substrate of one conductivity type, and in this connection p-type monocrystalline silicon wafers are the preferred substrate, although n-type silicon substrate wafers, epitaxial monocrystalline n- or p-type silicon layers on a monocrystalline dielectric substrate such as sapphire, and other semiconductive materials are contemplated for different embodiments of the invention.

As also indicated, the present devices comprise at least one floating gate, electrically isolated conductor overlying the substrate. The floating gate conductor may be a conducting polysilicon gate surrounded completely by an insulating material, such as thermally grown silicon dioxide. The floating gate may be separated from the substrate by conventionally grown silicon dioxide dielectric layers of readily manufacturable thickness, such as in the range of from about 500 to about 15000 Angstroms thick. The upper surface of the floating gate disposed away from the semiconductor substrate may be fabricated in such a manner to contain a large population of asperities, which are minute areas of polysilicon with many sharp needle-like protrusions. Electron emission can occur from such points to an overlying erase electrode, (which may also be fabricated of polycrystalline silicon) at relatively low applied voltages of less than about 30 volts due to enhanced Fowler-Nordheim tunnel emission and other mechanisms. The means of injecting charge onto the floating gate may comprise a program control electrode similarly fabricated from polysilicon and underlying a portion of the floating gate. The upper surface of the program control electrode may similarly be provided with an upper surface having a population of asperities such that electron emission from the program control electrode to the floating gate may be similarly carried out at relatively low applied voltages of less than about 30 volts potential difference between the program control electrode and the floating gate.

As also indicated, means for sensing the stored charge on the floating gate is provided, and in this connection a portion of the floating gate may form the gate of the sense transistor positioned in said substrate. If electrons are present on the floating gate, the (e.g., n-channel) transistor may be turned off. If electrons have been removed from the floating gate, its potential is positive and the (n-channel) sense transistor is turned on. The on or off condition of the floating gate sense transistor forms the means for detecting the presence or absence of charge on the floating gate and thus provides the basis for memory operation.

An important element of the present devices is an electrically isolatable bias electrode located within the substrate at the substrate surface adjacent the floating gate, and of opposite conductivity type relative to the substrate. The bias electrode may be located in the area partially beneath the erase/store electrode separated from each by an oxide, such that it underlies both the floating gate and the erase/store electrode. Because the bias electrode is of opposite conductivity type to that of the substrate, it may be separated from the substrate electrically by pn junction action under the influence of a reverse bias potential, and means for so isolating the bias electrode should be provided in the devices. A primary function of the bias electrode is to properly bias by capacitive action the floating gate during electron injection to (i.e., during a write cycle) and electron emission from (i.e., during an erase cycle) the floating gate. There are several modes of controlling the bias gate potential. The bias electrode potential may be controlled by a switching circuit element or device, such as a transistor in the device substrate which connects the bias electrode to a predetermined reference voltage source when the transistor is turned on. When the switching element (such as the switching transistor) is off the bias electrode is brought sufficiently positive with respect to the programming electrode underlying the floating gate, electrons will tunnel from the programming electrode to the floating gate, which in turn alters the floating gate potential by making it relatively more negative. This negative alteration of the floating gate potential by application of electrons can be sensed by a suitable sensing means such as a MOS transistor. Similarly, the erase/store electrode, which at least partially overlaps the floating gate and is insulated from the floating gate may be brought to a predetermined positive potential so that electrons will tunnel from the floating gate to the erase/store electrode. In this manner, the floating gate may be provided with a relatively more positive voltage which can be sensed by a suitable means such as the sensing transistor.

The automatic self-regulating compensation circuit feature of the memory devices may be formed physically in the region below the coincident floating gate and bias electrode and substrate in order to shape the current pulse into the floating gate during a write operation when electrons are flowing to the floating gate from the program gate. Such a circuit feature tends to minimize the stress across the tunnel oxide between the programming gate asperities and the floating gate. However, after a large number of cycles of operation, higher stresses are required to write to the floating gate due to trapped charges in the oxide. This circuit adjusts for this condition automatically by providing additional stress when required. It is the combination of providing minimum stress to the floating gate, current pulse shaping, and providing extra stress to compensate for trapped charges which is a principal element in prolonging the number of useful cycles in devices in accordance with the present invention. Further, these features have been implemented in a very compact manner utilizing the semiconductor electrical nature of the bias electrode and its placement into the surface of the substrate semiconductor. In this regard, when in an electrically isolated condition, the bias electrode functions as a variable capacitive coupling means for capacitively coupling a major proportion of the potential of the erase/store electrode to the floating gate as a function of the floating gate potential. In this connection, the capacitive coupling of the erase/store electrode potential to the floating gate is utilized to develop a potential between the floating gate and the programming electrode sufficient to transfer electrons from the programming electrode to the floating gate. However, the capacitance of the capacitive coupling means is variable such that the portion of the erase/store electrode potential which is coupled to the floating gate decreases with decreasing potential of the floating gate, and more specifically decreases with increasing difference between the potential of the bias electrode and the floating gate. Accordingly, the transfer of charge to the floating gate from the programming electrode operates to decrease the capacitive coupling and consequently the transfer of charge to the floating gate.

Figure 2:
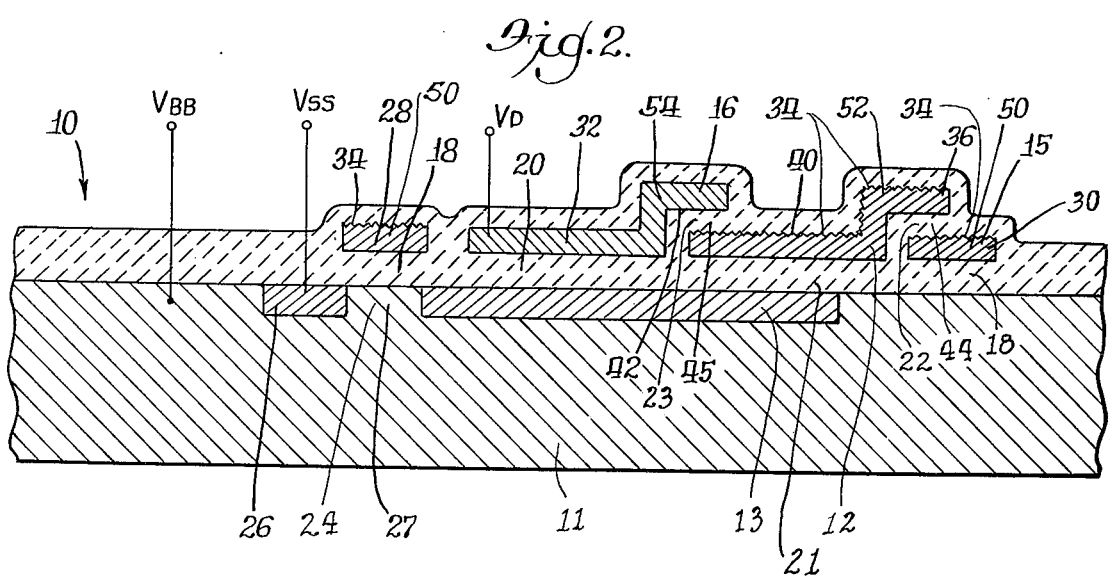
FIG. 2 is a cross-sectional side view of the embodiment of FIG. 1, taken through line 2—2.

Turning now to the drawings, the present invention will now be more particularly described with respect to the specific embodiment of a nonvolatile electrically-alterable semiconductor device 10 illustrated in FIGS. 1 and 2. Although the device 10 is an n-channel MOS device, it will be appreciated that other device technologies such as p-channel configurations may also be utilized and are contemplated herein.

As shown in FIGS. 1 and 2, the cell structure of the device 10 is fabricated on a monocrystalline p-type silicon wafer substrate 11 which in the illustrative embodiment 10 may have an acceptor doping level in the range of from about $1 \times 10^{14}$ to about $1 \times 10^{16}$ atoms per cubic centimeter. An electrically isolated, polysilicon floating gate 12 is provided adjacent the substrate, which is capacitively coupled to a bias electrode 13 in the substrate 11. The bias electrode 13 is formed in the substrate 11 of opposite conductivity type from the substrate 11, and in the embodiment 10 may have a donor impurity level of in the range of about $1 \times 10^{17}$ atoms/cc$^3$. The bias electrode 13 may be formed in accordance with conventional fabrication techniques such as diffusion or ion implantation, and in the illustrated embodiments may be formed to a thickness of about 1 micron by ion implantation of a donor impurity at an implantation density of $1 \times 10^{12}$ to $1 \times 10^{15}$ atoms per cm$^2$.

Electrode potential switching means 14 is provided in the device structure for supplying a predetermined potential to the bias electrode 13, and for electrically isolating the bias electrode. Means 15 is similarly provided for injecting electrons to the floating gate 12, and means 16 for removing electrons from the floating gate 12 are also provided, together with means 17 for sensing the charge state of the floating gate 12.

The substrate 11 and the bias electrode 13 are separated from the floating gate and other polycrystalline electrodes forming the means 14 for biasing and isolating the electrode 13, the electron injecting means 15 and the floating gate electron emission inducing means 16, by a thermal oxide dielectric 18 which in the illustrated embodiment is grown by conventional thermal oxidation techniques to an inter-element thickness of about 1000 Angstroms.

In this connection, the means 14 for biasing and electrically isolating the bias electrode 13 in the monocrystalline substrate 11 comprises a select switch MOS transistor element 24 formed between the bias electrode 13, an intermediate zone 27 of the substrate 11, and a bias potential supply zone 26 of the same conductivity type as the bias electrode 13, with a polycrystalline silicon MOS select gate electrode 28 adapted to control the conductivity of the p-type substrate zone 27 between the bias electrode 13 and the bias potential supply zone 26. The bias potential supply zone may be diffused or implanted into the substrate by conventional manufacturing techniques, and should best have a relatively high doping level to provide high conductivity. The values of substrate doping and oxide thickness between the select gate of bias electrode switching transistor 24 and the substrate zone 27 are chosen to give a desired threshold voltage in accordance with conventional design practice.

Similarly, the floating gate 12, the electron injecting means 15, and the electron removing means 16 are formed of polysilicon layers suitably sequentially deposited, and etched and oxidized to form the desired structure as indicated in FIGS. 1 and 2. In the illustrated embodiment, three sequentially deposited layers 50, 52, 54 of polysilicon are used. The bias electrode select gate electrode 28 may be formed from any of the three polysilicon layers but in the illustrated embodiment is formed from the first layer 50. The means 15 for injecting electrons in the form of a program gate electrode 30 is similarly fabricated from the first polysilicon layer 50, which is deposited on the silicon oxide dielectric layer formed by oxidation of the substrate 11. The first polysilicon layer 50 is treated to produce surface asperities 34 by oxidation at approximately 1000° C. A similar procedure is performed on the second layer 52 of polysilicon used to form the floating gate 12. The purpose of this procedure is to introduce asperities 34 on the upper surfaces 36, 40 of the programming gate electrode and the floating gate as indicated by the serrations in FIG. 2. The asperities are small projections at the surface which are present in numerous quantity (e.g., there may be a real density of $5 \times 10^9$ asperities per cm$^2$). A large portion of the asperities may have an average height greater than their base width (e.g., a base width of about 450 Angstroms and a height of about 750 Angstroms). The tips of the asperities are believed to have a very small radius of curvature which is capable of producing high local fields at relatively low average field strength, thus reducing the field strength necessary for tunneling. These high local fields are sufficient to inject electrons into relatively thick oxides (for tunneling purposes, using the term "tunneling" in a broad sense) while applying on the average a relatively low voltage difference across the oxide. In a smooth surface lacking such asperities, electrons are not injected into the thick oxide at the low voltages. Suitable asperities 34 can be generated over a range of conditions and a range of sizes, and are not limited to the particular example stated above. A third polysilicon layer 54 is deposited (after oxidation of the second floating gate layer 52) over the floating gate 12 and processed to form an erase/store electrode 32, which in conjunction with the asperities on the top surface of the floating gate 12 forms the means 16 for removing electrons from the floating gate.

The oxides 18, 20, 21, 22, 23 separating and insulating the various polysilicon layers 50, 52, 54 may be fabricated by well known techniques such as thermal oxidation. Similarly, the patterned polysilicon layers 50, 52, 54 may be patterned and fabricated by well known semiconductor photolithographic techniques.

The overlapping region 44 between the floating gate 12 and the programming electrode is the area in which electrons tunnel through the separating oxide 22 from the programming gate to the floating gate. By appropriately biasing the floating gate 12 with positive polarity in respect to the programming electrode 30, electrons will tunnel from the programming electrode 30 to the floating gate 12. The electron charge is injected from the asperities 34 at the surface of the program control electrode by enhanced tunneling into the separating oxide 22 and travels to and is collected by the floating gate 12 under the influence of the positive bias. After the biasing voltage is removed from the floating gate 12, the tunneled electrons are confined on the floating gate as they do not have the energy to surmount the isolating oxide energy barrier. The electrons may be retained substantially indefinitely on the floating gate unless removed.

Electrons may be removed from the floating gate by means of an erase/store electrode fabricated in polysilicon having a smooth lower surface separated by a suitable dielectric such as silicon oxide disposed adjacent a portion of the surface of the floating gate which does possess a high density of asperities. By appropriately biasing the erase/store gate at a sufficiently high positive potential with respect to the floating gate, electrons may be caused to tunnel from the asperities on the upper surface of the floating gate to the erase/store gate. In this manner, the floating gate may be provided with a relatively positive charge, i.e., turned on for an n-channel device. The overlapping region 45 between the erase/write electrode 32 and the floating gate 12 is the area in which electrons tunnel through the separating oxide 23 from the floating gate to the erase/write electrode. In the illustrated embodiment, these oxides 22, 23 are approximately 1000 Angstroms thick and are thus easily manufacturable in a reliable and reproducible manner. In this connection, while a 1000 Angstrom silicon oxide dielectric thickness is used in the illustrated embodiment as an optimum thickness, the optimum thickness may change as manufacturing techniques are improved.

As indicated, means 17 is provided for sensing the potential of the floating gate 12, and in this connection, as shown in FIG. 1, a portion 19 of the floating gate 12 extends beyond the bias electrode 13 to form the gate electrode of a MOS sense transistor 56 comprising N-type source and drain regions 58, 60 separated by an intermediate portion of the p-type substrate, the conductivity of which is governed by the charge on the floating gate.

In operation of the device 10, the floating gate 12 is either charged with an excess number of electrons, which causes its voltage to be low (negative) and thereby functions to turn off the remotely located sense transistor 56, or the floating gate is charged relatively positive by a removal of electrons which causes its voltage to be high, thereby turning on the remotely located transistor 56. The exact configuration and location of the remote sense transistor, the gate of which is formed by a portion of the floating gate 12, is not essential and many variations may be provided. The on or off nature of the remotely located sense transistor 56 forms the basis for detecting the memory state of the floating gate 12 of the device 10. This memory state of the floating gate 12 may be altered by writing (or "programming") electrons to the gate, and by removing (or "erasing") electrons from the gate.

In operation, the erase/store electrode 32 and the floating gate 12 have substantial capacitative interaction with the bias electrode 13 in the substrate 11. In this regard, it should be noted that the erase/store electrode 32 overlaps a portion of the bias electrode 13 forming a coupling capacitor CC3 of capacitance determined by factors including the overlap area and thickness of oxide dielectric 20. Similarly, the floating gate 12 overlaps a portion of the bias electrode forming a coupling capacitor CC2 of capacitance determined by the overlap area and the thickness of insulation 21, the voltage difference of the floating gate 12 relative to the bias electrode 13 and the doping density N of the bias electrode. These circuit elements are shown semi-schematically in FIG. 3. In the region of capacitative overlap between the floating gate 12 and the bias electrode 13, a self-regulating compensation circuit element is provided due to the nature of the voltage variable capacitor CC2 as will be more fully described.

In writing, or programming, of the device 10, excess electrons are introduced onto the floating gate 12 from the programming electrode 30. In order to carry out a writing cycle of steps to introduce excess electrons onto floating gate 12, a tunnel current pulse of electrons is directed onto the floating gate 12 from the programming electrode 30. This tunneling occurs in the overlap region 44 by raising the floating gate 12 to a sufficiently positive voltage with respect to the programming electrode 30.

In order to raise the relative potential of the floating gate 12, the capacitance coupling of the erase/store electrode 32 and the floating gate 12 to the bias electrode 13 is utilized. To carry out a write cycle, the gate transistor 24 may be rendered conductive to a reference voltage source more positive than the substrate 11 voltage by an appropriate potential $V_{on}$ applied to select gate electrode 28, so that the bias electrode 13 is substantially equilibrated to the potential of the voltage source 26 and is electrically isolated from the substrate by the reverse biased p-n junction action. The programming electrode 30 may concommitantly be held at a predetermined reference voltage. The select gate transistor 24 may then be rendered nonconductive by application of a suitable potential $V_{off}$ to select gate electrode 28 to leave the bias electrode floating. The erase/store electrode 32 may then be activated by application of a positive voltage $V_D$. Because the erase/store electrode is capacitively coupled to the bias electrode (by capacitance CC3), the bias electrode 13 will tend to follow the erase/store electrode 32 up in voltage for suitable choice of ratios of capacitance of CC2 to the capacitance CC3. As mentioned above, capacitor CC2 is the coupling capacitance between the floating gate 12 and the bias electrode 13. When the bias electrode 13 reaches a sufficiently high voltage with respect to the programming electrode 30, electrons will tunnel from the programming electrode to the floating gate 12. In the preferred mode of operation, the programming electrode 30 and the voltage source 26 are held at some DC voltage, $V_{SS}$, which is typically ground potential (zero volts). The substrate voltage $V_{BB}$, is held at a DC voltage more negative than $V_{SS}$, with $V_{BB}$ being typically in the range of from about $-2$ to about $-5$ volts.

More specifically, a write cycle begins by pulsing select gate electrode 28 from the "off" position (typically zero volts) to the "on" position (typically from about 2 to about 5 volts) for a period of time sufficient to substantially equilibrate the bias electrode 13 to the potential $V_{SS}$ of the voltage source 26, which in the illustrated embodiment 10 may be about 10 nanoseconds. Then the select gate electrode 28 is turned off, leaving the bias electrode 13 floating, or isolated by p-n junction action, at potential $V_{SS}$.

The erase/store electrode 32 is maintained at potential $V_{SS}$ during the equilibration of the bias electrode 13. Subsequently, the erase/store electrode 32 is raised to a write potention $V_D$ of approximately 25 volts, which potential is coupled via capacitor CC3 to the floating bias electrode 13, and then coupled to the floating gate 12 via capacitor CC2. The various operating, control and sensing potentials may be applied by suitable contacts from an external or on-chip power supply, or, at least in part, may be generated on-chip. The illustrated device 10 may be part of an array of devices (such that the various potential connections are shown semi-schematically) which may include suitable means for addressing the individual cells, as well as for providing and switching the various voltage potentials and pulses. The capacitive coupling of the erase/store electrode 32 and floating gate 12 to the bias electrode 13 is an important feature in the operation of the device 10. In this connection, the ratio of CC2 to CC3 should desirably be in the range of from about 1:2 to about 2:1, and more preferably in the range of about 1:1. In the illustrated embodiment, CC2 is substantially equal to CC3 with this ratio of CC2 and CC3 (and other capacitative effects) of the illustrated embodiment 10 being chosen in such a way.

The illustrated device 10 provides self-regulating stress compensation during the writing of electrons to the floating gate 12 from the programming electrode 30. If the doping concentration of the bias electrode region is very high (e.g., above about $10^{18}$ atoms per cm$^3$), capacitance CC2 may be considered to be a substantially "metal like" potential invariant capacitative plate in respect of transferring potential applied to the erase/store electrode 32, to the programming electrode 30, via the bias electrode 13 and the floating gate 12. However, by appropriate control of doping density of the bias electrode 13, the capacitative potential interconnective effect may be made variant in a predetermined manner to aid in prolonging device lifetime.

Because the capacitance CC2 provided between the bias electrode 13 and the floating gate 12 may be rendered voltage dependent, and because tunneled charges from the programming electrode 30 affect the potential on the floating gate 12, this variable capacitance can be exploited to shape and limit the tunnel current in a self-regulating and compensating manner. Such pulse shaping of the floating gate tunnel current may be utilized to enhance the number of useful cycles in the device. In a similar manner, compensation may be provided which effectively adds more electric field stress across the tunnel electrodes as the device begins to degrade through use.

This self compensating feature utilizes particular physical properties of the electrically isolated "floating" bias electrode 13 which is formed of a region of opposite conductivity from the substrate 11. The bias electrode 13 when left floating by disconnection from voltage source $V_{SS}$ accordingly forms a junction isolated region in the substrate which is electrically isolated from the substrate, the floating gate and other electrodes. The capacitance CC2 between the floating gate and the bias electrode is principally determined by factors including the voltage difference between these device elements, the thickness and dielectric constant of the intervening insulating layer, and the doping intensity of the bias electrode region. When the floating gate 12 has a positive potential with respect to the bias electrode 13, the capacitance CC2 between them is fixed at a maximum, principally determined by the area of overlap and the thickness and dielectric constant of the insulating silicon dioxide layer 21. Accordingly, pulse shaping of the tunnel current to the floating gate from the programming electrode 30 arises from the variable nature of this capacitance. Specifically with respect to electron injection, or "writing", so long as no tunneling from the programming electrode 30 in the floating gate 12 occurs, the potential difference between the bias electrode and floating gate may remain small through suitable choice of capacitances CC2 and CC3. However, once tunneling commences from the programming electrode 30 to the floating gate 12, the floating gate potential becomes increasingly negative relative to the bias gate electrode 13. This causes a drop in the total drive voltage across the tunneling electrode because the effective coupling capacitance between the floating gate and the bias electrode is reduced. The effect of this is to shape, control, and limit the maximum peak currents allowed to flow from the programming electrode to the floating gate. It is well known that the control of the tunnel current through oxides can enhance the total number of cycles available and therefore provide improved performance.

Figure 3:
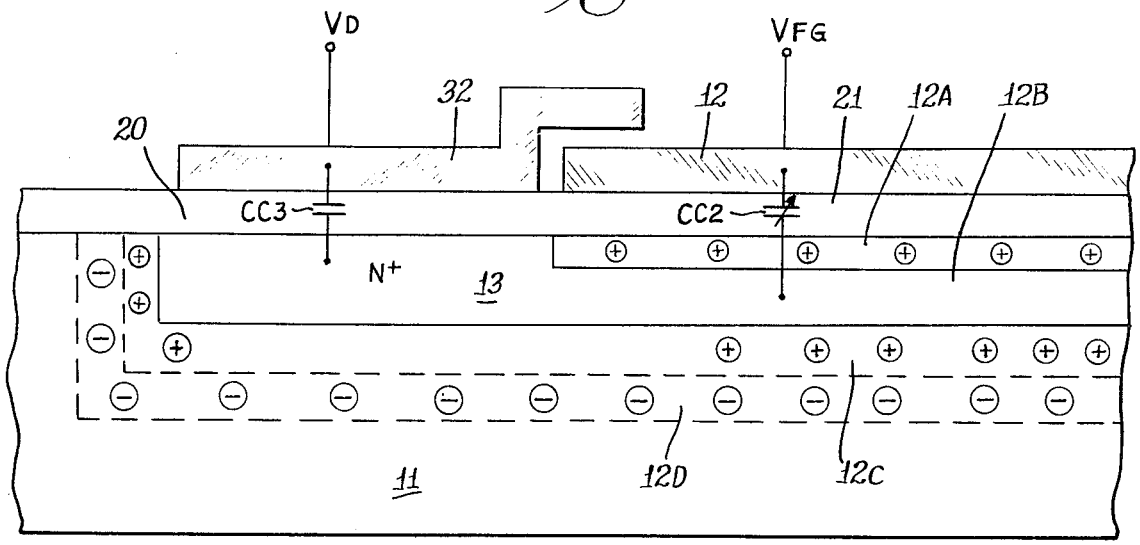
FIG. 3 is a schematic cross-sectional circuit diagram representing the self-regulating circuit area of the embodiment of FIG. 1 including the bias electrode, floating gate, and erase/store electrode gate circuit elements of the embodiment of FIG. 1.

As indicated, once tunneling to the floating gate has occurred, the potential on the floating gate 12 becomes negative with respect to the floating bias electrode 13 and this tends to decrease the capacitance CC2. Referring to FIG. 3, when the potential on the floating gate 12 is less than potential at a zone 12B internally of the surface of the bias electrode, a depletion region 12A forms which causes CC2, the coupling capacitor between the floating gate and the bias electrode, to decrease. The region 12B can be considered as a "wire-like" connection, or the common connection, between capacitance element CC2 and capacitance element CC3. Similarly, regions 12C and 12D are formed in the substrate which are depletion regions which form the reverse bias junction isolation of region 13 from the substrate 11. These depletion effects which occur when the potential of the floating gate 12 is less than the potential of the bias electrode 13 decrease the capacitance CC2 between the floating gate and the bias electrode. The variable capacitance of an electrode in respect of a depletion region may be represented as a function of the potential between the electrode and the substrate [Boyle & Smith (1970), "Charge Coupled Semiconductor Devices", Bell Systems Technical Journal, 49, pp. 587-593] and in the illustrated embodiment, the variable capacitance CC2 of the floating gate 12 with respect to the bias electrode 13 may be substantially represented as:

$$CC2 = \sqrt{1 + \frac{2C_o}{B}(\Delta V - V_{FB})}$$

where $C_o$ is maximum capacitance value (per cm²) of the capacitor formed by the adjacent surfaces of the floating gate 12, defined as $$C_o = \frac{\epsilon}{x}, \text{ and } B = q\frac{K_s N_x}{K_d},$$

where
$\epsilon$ is the dielectric constant of the silicon dioxide region 21 between the floating gate 12 and the bias electrode 13,
x is the thickness of the dielectric region 21 between the floating gate 12 and the bias electrode 13,
q is the electronic charge,
$K_s$ is the relative dielectric constant of silicon,
$K_d$ is the relative dielectric constant of the region 21 separating the bias electrode 13 and the floating gate 12,
N is the doping density of the bias electrode 13,
$\Delta V$ is the potential $V_{N+}$ of the bias electrode 13 minus the potential $V_{FG}$ of the floating gate 12, where $\Delta V$ is approximately greater than zero, and
$V_{FB}$ is the flat band voltage.

Accordingly, CC2 can vary from being almost equal to $C_o$ (a constant) for very high doping density (N) to almost zero for very low doping density (N), with other parameters being constant. The capacitance CC2 thus becomes less as the floating gate 12 beings to receive electrons and falls negative. However, when $\Delta V$ is less than zero, capacitance CC2 is substantially at its relatively constant, maximum value, $C_o$.

Figure 4:
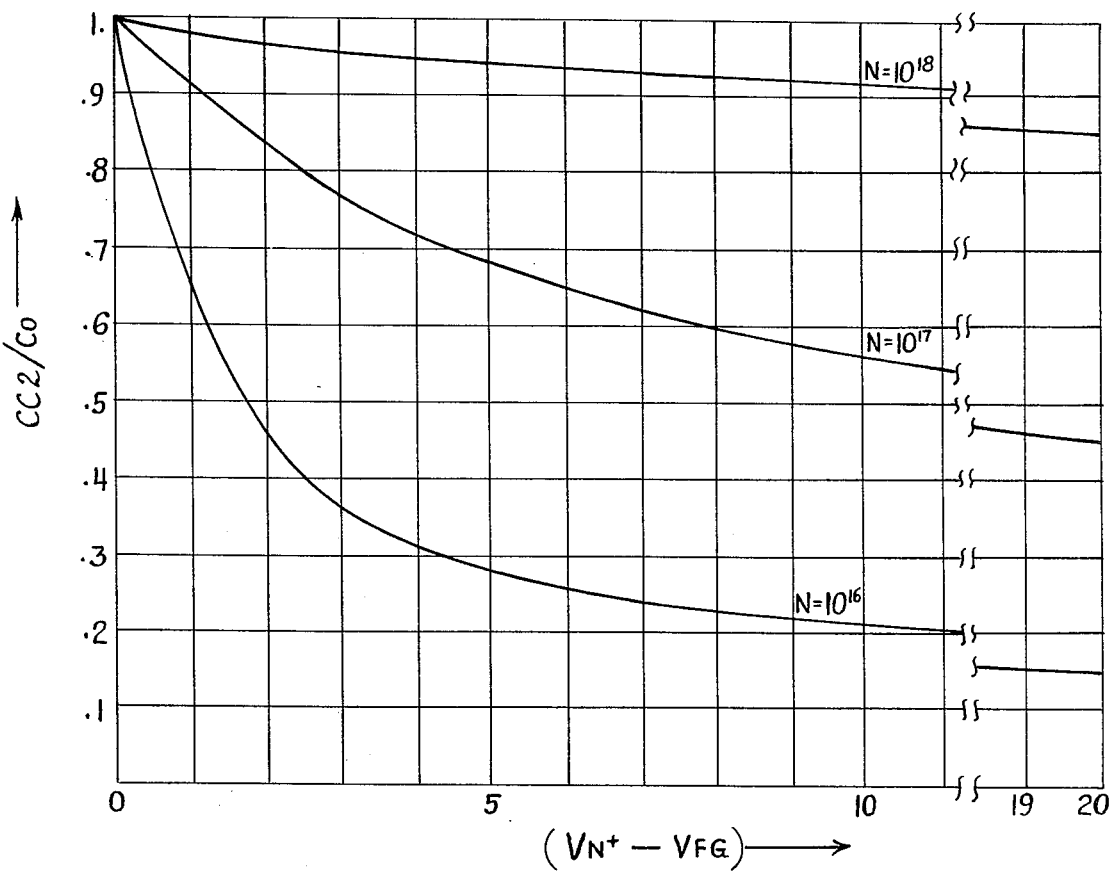
FIG. 4 is a graphic representation of device regulating capacitance as a function of the difference in potential between the bias electrode and the floating gate for several doping levels.

Because the variable capacitance CC2 controls the voltage coupling of the floating gate 12 to the bias electrode zone 13, and accordingly the potential difference between the programming electrode 30 and the floating gate, which drives the tunneling current, may be beneficially controlled by control of the doping density N in the bias electrode. The variation in capacitance CC2 for the device structure of the type shown in the illustrated embodiment is graphically shown in FIG. 4 for various doping levels of the bias electrode 13. In FIG. 4, the ratio of CC2 to $C_o$ is plotted against the voltage difference $\Delta V$ between the bias electrode potential $V_{N+}$ and the potential $V_{FG}$ of the floating gate 12, for doping levels of $1 \times 10^{16}$ donor atoms/cm³, $1 \times 10^{17}$ donor atoms/cm³, and $1 \times 10^{18}$ donor atoms/cm³, for a silicon dioxide dielectric thickness of about 800 Angstroms. A particularly preferred range of variability of the capacitance CC2 during the write cycle is shown for a bias electrode doping level of $N = 10^{17}$ atoms/cm³, which produces a $CC2/C_o$ ratio between about 0.5 and 0.6 during the write cycle, in which $\Delta V$ will typically be from about 9 to about 10 volts after electron injection. Accordingly, the capacitance CC2 decreases by a factor of almost 2 during a write cycle for the illustrated $1 \times 10^{17}$/cm³ doping example. In embodiments of the present devices in which a variable capacitance is provided, the doping concentration will range from about $5 \times 10^{16}$ to about $5 \times 10^{17}$ in the bias electrode 13. In such embodiments, the capacitance CC2 should best decrease by a factor of from about 3 to about 2 during the write cycle (i.e., will decrease to about 0.33 to about 0.5 of the initial value, $C_o$). Since the capacitance CC2 is a function of and decreases as a function of total tunnel current (i.e., negative charge) to the floating gate, the tunnel current itself decreases its own driving potential and is effectively self-limiting when the desired amount of charge has been placed on the floating gate during a write cycle.

Thus, it will be appreciated that the device 10 has a structural configuration that self-regulates and controls the tunnel current. The total number of usable cycles available in this floating gate device depends on peak current and tunnel current shapes used in writing of the electrons, and the character of capacitance CC2 operates to keep the currents low and impress the minimum possible effective stress to enhance device lifetime.

A further feature of the variable CC2 capacitor is that it also tends to provide increased stress when the device becomes more difficult to program, such as after a number of cycles. In this regard, the structure of the device 10 allows the electrical field stress on the floating gate 12 to rise until programming begins to occur, whereupon the self-regulating action brought about by the decrease of CC2 causes reduction in the driving field. However, after a number of cycles, the tunnel current may not begin until the field stress reaches a higher value. In this manner, the device 10 tends to compensate for the need for increased stress when device use degrades the properties of the oxide in the region.

In summary, a circuit system which is inherently a part of the memory cell 10 has been provided which automatically shapes and limits the electron tunnel current, which tends to increase the number of write cycles available to the device. Further, even when the write properties begin to degrade, the inherent circuit system also acts to increase the stress to overcome device degradation. These features tend to substantially add to the useful length of service for the memory device 10. The floating gate 12 of the device 10.

Is also electrically erasable, such that electrons may be removed from the floating gate 12 of the memory device by an appropriate "erasing" procedure. In order to remove electrons stored on the floating gate 12, the erase/store electrode 32 is raised to a sufficiently positive voltage with respect to the floating gate 12 such that electrons are emitted from asperities 34 on the floating gate upper surface 40 to the smooth lower surface 42 of the erase/store electrode 32.

In order to remove electrons from the floating gate 12, the select gate transistor 24 is rendered conductive (by applying a potential $V_{GS}$ of about 5 volts via the $V_{on}/V_{off}$ switch to select gate electrode 28, as seen in FIG. 1). The select transistor 24 is maintained in a conductive state during the entire erase cycle so that the bias electrode is kept at the fixed reference potential $V_{SS}$ by conductive connection to voltage supply zone 26 throughout the cycle. Because the floating gate 12 is capacitively coupled to the bias electrode 13 it tends to be held capacitively near the fixed reference potential $V_{SS}$ of the bias electrode. The erase/store electrode 32 is then biased to a sufficiently high potential $V_W$, such that a voltage difference is developed between the erase/store electrode 32 and the floating gate 12, sufficient to cause electrons to tunnel from the floating gate 12 to the erase/store electrode 32 from the asperities 34 at the top surface 40 of the floating gate to the erase/store electrode 32, which leaves the floating gate 12 positively charged. This relatively positive charge of the floating gate 12 may be sensed by testing the conductivity of the remote sensing transistor 56, the gate of which is formed by an extension of the floating gate. Because the floating gate has a relatively positive potential with respect to the potential $V_{SS}$, the remote sensing transistor 56 is turned on so that current is conducted between the N+ source-drain zones when a suitable potential is applied thereacross.

Thus, in accordance with the present invention, electrically-erasable memory devices and methods have been provided which have desirable characteristics and which may incorporate self-regulating and compensating device structure to extend useful life of the device. Devices in accordance with the invention can be readily fabricated using standard MOS techniques.

The devices in accordance with the invention can be used to form a memory array such as an electrically-alterable read only memory array (EAROM) with addition of commonly known decoding and buffering systems. The present devices may also be utilized to form fault tolerant elements which, for example, may improve device manufacturing yield or to provide alternate logical paths in a microcomputer chip. These and other circuit combinations may be utilized in useful and readily realizable integrated circuits.

Although the invention has been specifically described with respect to a particular embodiment and operating mode, it will be appreciated that numerous variations, modifications and adaptations may be made. For example, illustrated in FIGS. 5 and 6 is another embodiment 100 of a nonvolatile, electrically alterable memory cell in which an electrode array having laterally arranged asperities and floating gate tunneling currents is provided.

In this regard, the device 100 comprises a monocrystalline p-type silicon substrate 102, having a monocrystalline n-type bias electrode 104 therein connected to a suitable bias electrode voltage source via an input transistor (not shown) at the terminal end of a channel extension 106 of the bias electrode 104. Overlying and in capacitive relationship to the bias electrode, and separated therefrom by a suitable silicon dioxide layer 108 (e.g., 500-1000 Å thick) are polysilicon erase/store electrode 110 and the electrically isolated polysilicon floating gate 112. An extension 114 of the floating gate 112 forms the gate of MOS sense transistor 116 comprising n-type source and drain regions, and further extends to be adjacent polysilicon programming electrode 118. The programming electrode 118 may be fabricated from a first polysilicon layer, the floating gate 112 from a second polysilicon layer, and the erase/store electrode from a third polysilicon layer so as to provide immediately adjacent structures as shown in the drawings. The programming electrode is provided with asperities 120 immediately adjacent (but separated therefrom by a 500-1000 Å silicon dioxide layer 122) the floating gate for tunneling of electrons from the programming gate to the floating gate. Similarly, the floating gate 112 is provided with asperities 124 immediately adjacent (but separated therefrom by a 500-1000 Å silicon dioxide layer 126) the erase/store electrode for tunneling of electrons from the floating gate to the erase/store electrode. The fabrication of such lateral electrode structures may be, for example, fabricated by conventional techniques [e.g., U.S. Pat. No. 4,053,349] and the device 100 may be operated as generally described in connection with the operation of the device 10. As another embodiment, a memory cell in accordance with the invention may be constructed together with a RAM memory cell to provide for permanent retention of the RAM cell contents. A large array of memory devices may be provided having X and Y select electrodes and/or implants to produce an addressable nonvolatile memory array. Such adaptations, modifications and variations are intended to be within the spirit and scope of the present invention.

Various of the features of the invention are set forth in the following claims.

What is claimed is:

1. A nonvolatile electrically alterable semiconductor device comprising
a semiconductor layer of one conductivity type, an electrically isolatable bias electrode at the surface of said semiconductor layer, and of conductivity type opposite that of said substrate, an electrically isolated floating gate conductor overlying said bias electrode and in capacitive relationship therewith, a programming electrode adjacent said floating gate for introducing electrons to said floating gate, an erase/store electrode adjacent said floating gate for removing electrons from said floating gate upon the development of an electrical field between said floating gate and said erase/store electrode, said erase/store electrode overlying and being in capacitive relationship to said bias electrode, means for electrically isolating said bias electrode and for providing a predetermined electrical potential thereto, and means for sensing the electrical potential of said floating gate.

2. A nonvolatile, electrically alterable semiconductor device in accordance with claim 1 wherein said semiconductor layer is a substantially monocrystalline silicon substrate.

3. A nonvolatile, electrically alterable semiconductor device in accordance with claim 1 wherein said semiconductor substrate is a p-type substrate and wherein said bias electrode is an n-type zone in said substrate.

4. A nonvolatile, electrically alterable semiconductor device in accordance with claim 1 wherein said semiconductor layer is an epitaxial p-type silicon layer on a substantially monocrystalline substrate.

5. A nonvolatile, electrically alterable semiconductor device in accordance with claim 4 wherein said monocrystalline substrate is a monocrystalline sapphire or spinel substrate.

6. A nonvolatile, electrically alterable semiconductor device in accordance with claim 1 wherein said means for sensing the floating gate potential comprises a MOS transistor, the gate of which is formed by a portion of said floating gate conductor.

7. A nonvolatile, electrically alterable semiconductor device in accordance with claim 1 wherein said means for electrically isolating said bias electrode comprises a switching transistor for connecting said bias electrode to a voltage source and for disconnecting said bias electrode from said voltage source under the control of said switching transistor.

8. A nonvolatile, electrically alterable semiconductor device in accordance with claim 1 wherein said means for electrically isolating said bias electrode comprises a MOS transistor formed in part by a portion of said bias electrode.

9. A nonvolatile, electrically alterable semiconductor device in accordance with claim 1 wherein said programming electrode is a polycrystalline silicon electrode separated from said floating gate conductor by silicon dioxide and wherein said programming electrode is provided with surface asperities adjacent said floating gate for enhancing electron flow from said programming electrode to said floating gate under the influence of an electric field between said programming electrode and said floating gate.

10. A nonvolatile, electrically alterable semiconductor device in accordance with claim 9 wherein said erase/store electrode is a polycrystalline silicon electrode and wherein said floating gate conductor is a polycrystalline silicon layer separated from said erase/store electrode by silicon dioxide, and wherein said polysilicon floating gate is provided with surface asperities adjacent said erase/store electrode for enhancing electron flow from said floating gate to said erase/store electrode under the influence of an electric field between said floating gate and said erase/store electrode.

11. A nonvolatile, electrically alterable semiconductor device in accordance with claim 10 wherein a portion of said polycrystalline silicon erase/store electrode overlaps said polycrystalline silicon floating gate, and wherein a portion of said polycrystalline silicon floating gate overlaps said programming electrode.

12. A nonvolatile, electrically alterable semiconductor device in accordance with claim 1 wherein the capacitive coupling of said bias electrode to said floating gate is substantially larger than the respective capacitive coupling of said programming electrode to said floating gate and the capacitive coupling of said erase/store electrode to said floating gate.

13. A nonvolatile electrically alterable semiconductor device in accordance with claim 1 wherein the capacitive coupling of said bias electrode to said floating gate and the capacitive coupling of said bias electrode to said erase/store electrode are approximately equal and substantially larger than any other coupling capacitance of said device.

14. A nonvolatile, electrically alterable semiconductor device in accordance with claim 1 wherein the capacitance formed between said floating gate and said bias electrode is a variable capacitance which is dependent upon the voltage potential difference between said floating gate and said bias electrode.

15. A nonvolatile, electrically alterable semiconductor (memory) device in accordance with claim 1 wherein said capacitive relationship between said bias electrode and said floating gate comprises a variable capacitance which decreases with increasing difference between the bias electrode potential and the floating gate potential.

16. A nonvolatile, electrically alterable semiconductor device in accordance with claim 1 wherein said bias electrode has a doping level in the range of from about $5\times 10^{+16}$ atoms/cc to about $5\times 10^{17}$ atoms/cc.

17. A novolatile, electrically alterable semiconductor device in accordance with claim 1 wherein said floating gate conductor is separated from said programming electrode by a silicon dioxide dielectric layer having a thickness in the range of from about 500 Angstroms to about 1000 Angstroms, and wherein said floating gate is separated from said erase/store electrode by a silicon dioxide dielectric layer having a thickness in the range of from about 500 Angstroms to about 1000 Angstroms.

18. A novolatile, electrically alterable semiconductor device in accordance with claim 1 wherein a single positive polarity voltage coupled to said erase/store electrode causes, under the control of said means for electrically isolating said bias electrode, said introduction of electrons to said floating gate and said removing of electrons from said floating gate.

19. A method for altering the electric charge on a dielectric isolated floating gate conductor of a semiconductor memory device, comprising the steps of electrically isolating a substantially monocrystalline semiconductor bias electrode of one conductivity type which is capacitively coupled to said floating gate to provide said bias electrode in a substantially floating electrical condition, applying a first reference potential to a first electrode adjacent said floating gate but separated therefrom by an intermediate dielectric layer, applying a second electric potential to a second electrode which is capacitively coupled to said bias electrode and adjacent said floating gate but separated therefrom by an intermediate dielectric layer, capacitively coupling at least a major portion of said second potential from said second electrode to said bias electrode and from said bias electrode to said floating gate to develop a potential difference between said floating gate and said first electrode, and transferring electrons between said first electrode and said floating gate under the influence of the electric field provided by said potential difference between said floating gate and said first electrode to alter the electric charge on said floating gate.

20. A method in accordance with claim 19 wherein said bias electrode forms a p-n junction with a substantially monocrystalline semiconductor of conductivity type opposite that of said bias electrode and wherein said electrical isolation of said bias electrode is carried out by at least in part reverse biasing of said bias electrode with respect to said opposite conductivity type semiconductor.

21. A method in accordance with claim 19 wherein a portion of said floating gate overlaps a portion of said first electrode, wherein said first electrode is provided with asperities at the region thereof overlapped by said floating gate, wherein said electric field causes electrons to be transferred from said first electrode to said floating gate conductor, and wherein said bias electrode has a doping density such that the transfer of electrons from said first electrode to said floating gate reduces the capacitive coupling of said floating gate and said bias electrode.

22. A method in accordance wit claim 19 wherein the electrical charge on said floating gate is subsequently altered in a polarity opposite that caused by said transfer of electrons between said first electrode and said floating gate by applying a third electrical potential to said second electrode while maintaining said bias electrode at a second reference potential such that a second potential difference is developed between said floating gate and said second electrode, and transferring electrons between said floating gate and said second electrode under the influence of the electric field provided by the second potential difference provided.

23. A method in accordance with claim 22 wherein a portion of said second electrode overlaps a portion of said floating gate, wherein said floating gate is provided with asperities at the region thereof overlapped by said second electrode, and wherein said electric field between said second electrode and said floating gate causes electrons to be transferred from said floating gate to said second electrode.

24. A method in accordance with claim 23 wherein said second electric potential and said third electric potential are substantially equal and wherein the difference between said second and third potentials, and said reference potential applied to said first electrode does not exceed about 25 volts.

25. A method in accordance with claim 24 wherein said first reference potential applied to said first electrode and said second reference potential applied to said bias electrode are substantially equal.

26. A method in accordance with claim 22 wherein said first and second reference potentials are coupled to ground, and said second electrical potential and third electrical potential are both positive polarity voltages of sufficient magnitude to respectively effect said electron transfer to and from said floating gate.

* * * * *

UNITED STATES PATENT AND TRADEMARK OFFICE
CERTIFICATE OF CORRECTION

PATENT NO. : 4,274,012
DATED : June 16, 1981
INVENTOR(S) : Richard T. Simko

It is certified that error appears in the above-identified patent and that said Letters Patent is hereby corrected as shown below:

Column 9, lines 33-35, after the first occurrence of "CC3" delete "with this ratio ... in such a way".

Column 9, line 42, change "capacitative" to --capacitive--.

Column 10, lines 7-8, change "intensity" to --density--.

Column 11, line 33, delete "Because the" and substitute therefor --The--.

Column 14, line 6, after "nonvolatile" insert --,--.

Column 15, line 40, delete "(memory)".

UNITED STATES PATENT AND TRADEMARK OFFICE
CERTIFICATE OF CORRECTION

PATENT NO. : 4,274,012

DATED : June 16, 1981

INVENTOR(S) : Richard T. Simko

It is certified that error appears in the above-identified patent and that said Letters Patent is hereby corrected as shown below:

Column 15, line 50, change "novolatile" to --nonvolatile--.

Column 15, line 59, change "novolatile" to --nonvolatile--.

Column 16, line 43, change "wit" to --with--.

Signed and Sealed this

Seventh Day of January 1986

[SEAL]

Attest:

DONALD J. QUIGG

*Attesting Officer*   *Commissioner of Patents and Trademarks*